(12) United States Patent
Liu et al.

(10) Patent No.: US 8,510,687 B1
(45) Date of Patent: Aug. 13, 2013

(54) ERROR DIFFUSION AND GRID SHIFT IN LITHOGRAPHY

(75) Inventors: Pei-Yi Liu, Changhua (TW); Shy-Jay Lin, Hsinchu County (TW); Wen-Chuan Wang, Hsinchu (TW); Jaw-Jung Shin, Hsinchu (TW); Burn Jeng Lin, Hsinchu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 13/409,765

(22) Filed: Mar. 1, 2012

(51) Int. Cl.
*G06F 17/50* (2006.01)

(52) U.S. Cl.
USPC .................................. 716/55; 716/52; 716/54

(58) Field of Classification Search
None
See application file for complete search history.

(56) References Cited

U.S. PATENT DOCUMENTS

| | | | | |
|---|---|---|---|---|
| 5,103,101 A | * | 4/1992 | Berglund et al. | 250/492.2 |
| 5,708,514 A | * | 1/1998 | Higuchi et al. | 358/3.03 |
| 7,148,496 B2 | * | 12/2006 | Menon et al. | 250/492.22 |
| 7,364,838 B2 | * | 4/2008 | Lizotte | 430/321 |
| 7,488,933 B2 | * | 2/2009 | Ye et al. | 250/252.1 |
| 7,618,751 B2 | * | 11/2009 | Sandstrom et al. | 430/5 |
| 7,755,657 B2 | * | 7/2010 | Sandstrom et al. | 347/239 |
| 7,842,936 B2 | * | 11/2010 | Kruit et al. | 250/492.22 |
| 2005/0225806 A1 | * | 10/2005 | Damera-Venkata | 358/3.03 |

OTHER PUBLICATIONS

Unpublished U.S. Appl. No. 13/368,877 entitled "A Multiple-Grid Exposure Method", filed Feb. 8, 2012, 31 pages.
Unpublished U.S. Appl. No. 13/409,653 entitled "Non-Directional Dithering Methods", filed Mar. 1, 2012, 19 pages.

* cited by examiner

*Primary Examiner* — A. M. Thompson
(74) *Attorney, Agent, or Firm* — Haynes and Boone, LLP

(57) ABSTRACT

The present disclosure involves a method of data preparation in lithography processes. The method of data preparation includes providing an integrated circuit (IC) layout design in a graphic database system (GDS) grid, and converting the IC layout design GDS grid to a second exposure grid by applying an error diffusion and a grid shift technique to a sub-pixel exposure grid.

20 Claims, 5 Drawing Sheets

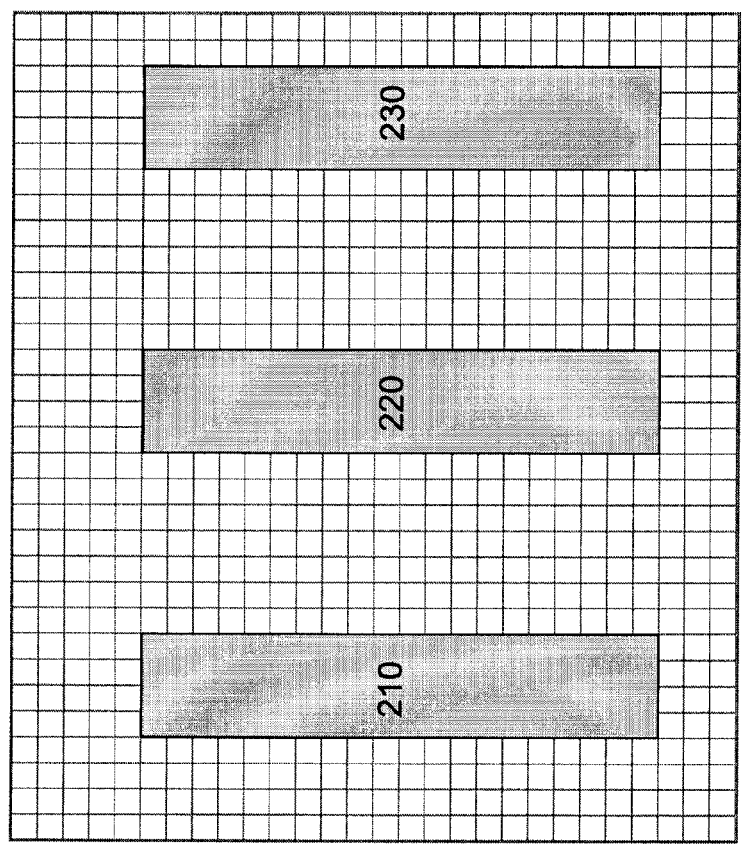
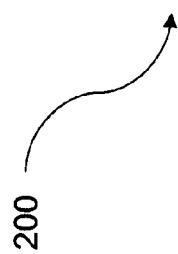
Fig. 2

ERROR DIFFUSION AND GRID SHIFT IN LITHOGRAPHY

BACKGROUND

The semiconductor industry has experienced exponential growth. Continuous advancements in lithographic resolution have been made to support critical dimensions (CDs) of 90 nm to 65 nm, 45 nm, 32 nm, 22 nm, 16 nm and beyond. New techniques in lithography have been developed, such as immersion lithography, multiple patterning, extreme ultraviolet (EUV) lithography and e-beam lithography. The challenges being raised by new lithography techniques are not only in resolution but also in economy (e.g. cost of upgrading and loss of throughput). Much development has focused on improving resolution without significant reduction in process throughput. However, current methods have not been satisfactory in all respects.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

FIG. 2 is a simplified schematic diagram of an IC layout design GDS grip of an example embodiment of a method of data preparation in lithography processes at stages constructed according to various aspects of the present disclosure.

DETAILED DESCRIPTION

It is to be understood that the following disclosure provides many different embodiments, or examples, for implementing different features of the invention. Specific examples of components and arrangements are described below to simplify the present disclosure. These are, of course, merely examples and are not intended to be limiting. Moreover, the performance of a first process before a second process in the description that follows may include embodiments in which the second process is performed immediately after the first process, and may also include embodiments in which additional processes may be performed between the first and second processes. Various features may be arbitrarily drawn in different scales for the sake of simplicity and clarity. Furthermore, the formation of a first feature over or on a second feature in the description that follows may include embodiments in which the first and second features are formed in direct contact, and may also include embodiments in which additional features may be formed between the first and second features, such that the first and second features may not be in direct contact.

Figure 1:
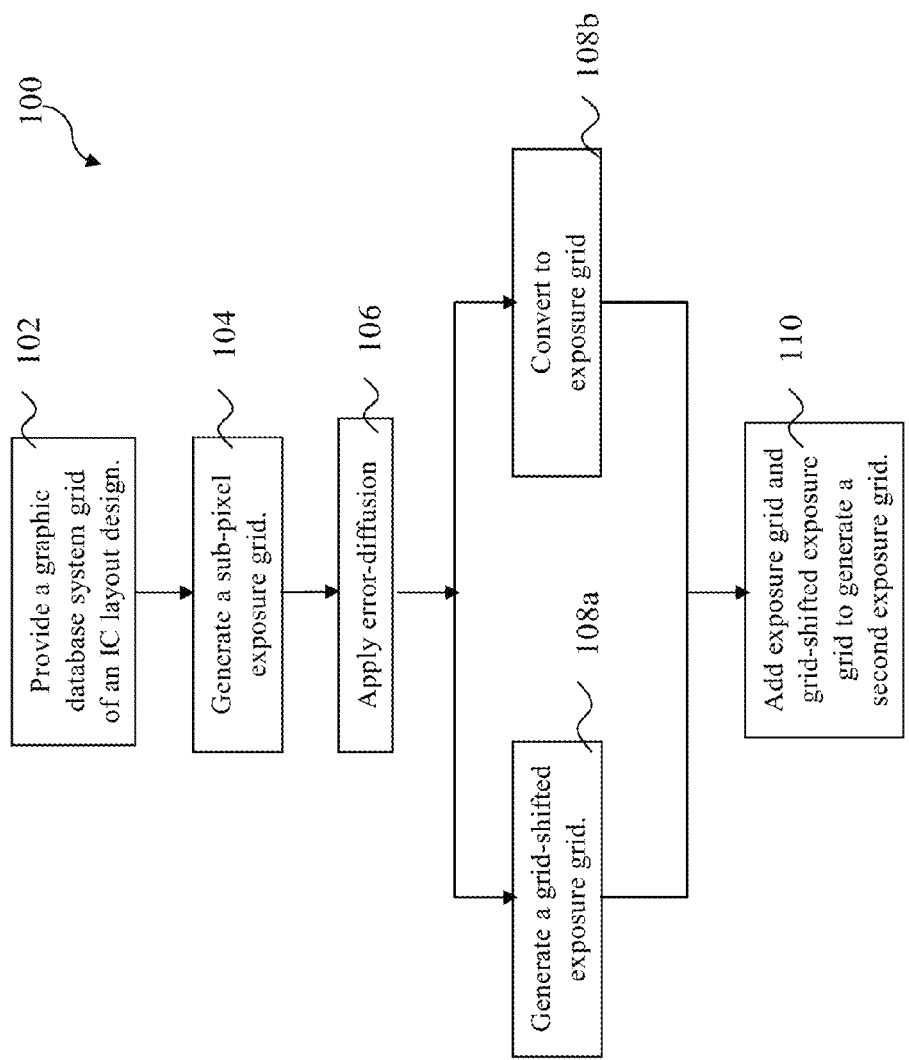
FIG. 1 is a flowchart of an example method of a data preparation in lithography processes at stages constructed according to various aspects of the present disclosure.

According to an embodiment of the present disclosure, a method 100 of data preparation in lithography processes is illustrated as a flowchart in FIG. 1. The method 100 includes blocks 102-110, each of which is discussed below in more detail and with reference to examples in various additional figures.

Referring to FIGS. 1 and 2, the method 100 begins at step 102 by providing an IC layout design in a GDS grid 200. The IC layout design may contain a plurality of semiconductor features. The IC layout design may be generated as a computer file, for example as a GDS type file or as an open artwork system interchange standard (OASIS) type file. The GDS or OASIS files are database files used for data exchange of IC layout artwork. For example, these files may have binary file formats for representing planar geometric shapes, text labels, as well as other layout information of the IC layout. The GDS or OASIS files may each contain multiple layers. The GDS or OASIS files may be used to reconstruct the IC layout artwork, and as such can be transferred or shared between various fabrication tools.

A proximity correction process may also apply to the GDS grid 200. The proximity correction process is a lithography enhancement technique that can be used to compensate for image errors due to process defects. For example, electron scattering during the performance of a maskless lithography process may adversely impact regions of the substrate near the region that is being exposed by the electron beams. Consequently, these nearby regions may become inadvertently exposed, thereby causing variations of the desired exposure pattern. To compensate for these image errors, proximity correction techniques such as dose modification, shape modification, or background correction exposure may be employed in a maskless lithography process. The performance of the proximity correction process in the GDS grid 200 makes the fabricated semiconductor feature patterns resemble the desired patterns more accurately.

For the sake of providing an example, a simplified IC layout design GDS grid 200 is illustrated in FIG. 2. The IC layout design GDS grid 200 includes a plurality of circuit sections 210-230, represented by a plurality of polygons. In the illustrated embodiment, the circuit sections 210-230 may include different logic sections and varying sizes. The sizes may refer to physical dimensions of the circuit sections 210-230 or the amount of data that is contained within each section. The IC layout design GDS grid 200 includes a two-dimensional array of pixels. Pixels are often represented using dots or squares in a coordinate system. Each pixel has an exposure intensity value (represented by a digital number) and a location address (corresponding to its coordinates).

Continuing with FIG. 2, a pixel size of the GDS grid 200 is selected typically to make boundaries of layout design pattern (such as polygons) fairly align with boundaries of pixels in the IC layout design GDS grid 200, as shown in FIG. 2. Pixels in the IC layout design GDS grid 200 are divided into two types: either interior or exterior of the polygon of the IC layout design. For an interior pixel (or an exterior pixel), a lithography exposure does is set at maximum intensity (or at minimum intensity), which is referred to as a black color or a white color, respectively.

Figure 3:
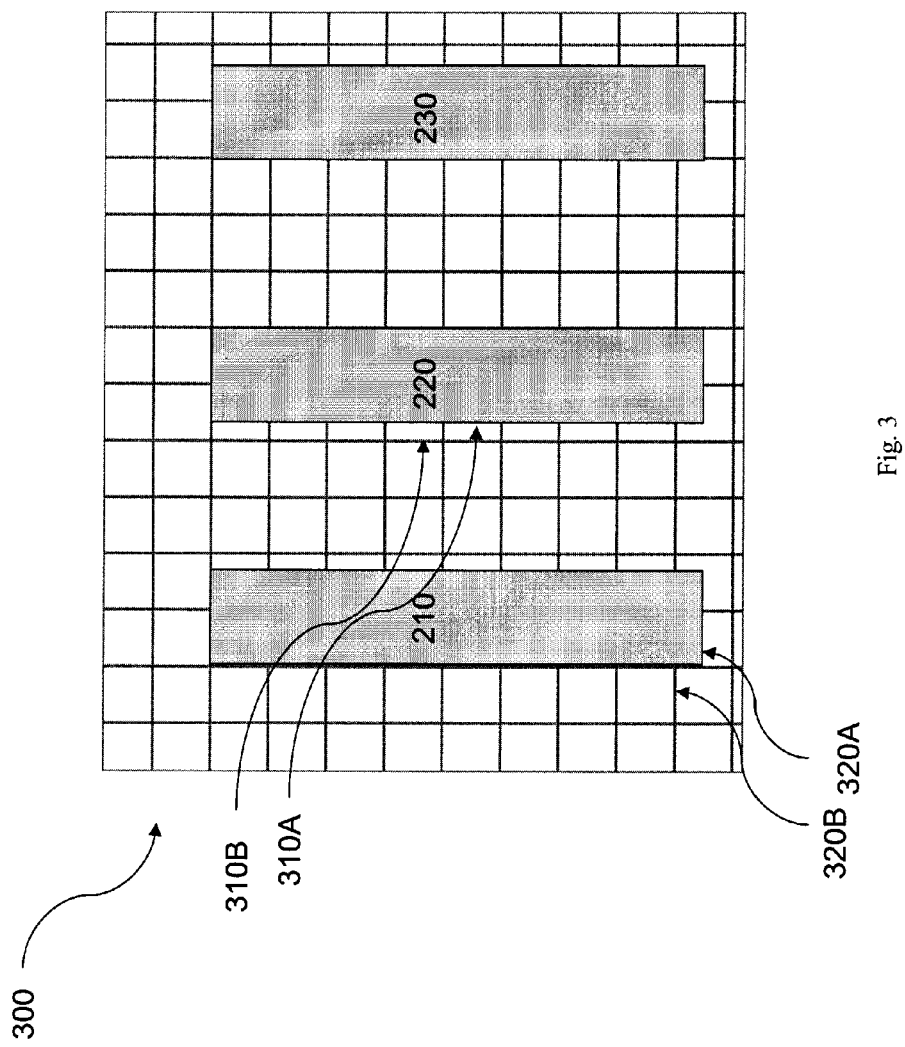
FIG. 3 is a simplified schematic diagram of a first exposure grid of an example embodiment of a method of data preparation in lithography processes at stages constructed according to various aspects of the present disclosure.

The method 100 proceeds to step 104 by converting the IC layout design GDS grid 200 to a sub-pixel exposure grid 300, a machine-specific form, as shown in FIG. 3. In order to implement the IC layout design GDS 200 by a lithography machine, a data preparation process is carried out to form a machine-specific data format. The data preparation process starts with converting the IC layout design GDS grid 200 to a machine-specific exposure grid, referred to as a sub-pixel exposure grid 300. The sub-pixel exposure grid 300 may include a two-dimensional array of pixels in a coordinate system. A lithography exposure process sweeps across the entire surface of a substrate to be patterned, pixel by pixel (or pixels by pixels). The pixel size of the sub-pixel exposure grid 300 impacts not only computing data volume in the data preparation process but also on the throughput in the downstream or later processing.

The pixel size of the sub-pixel exposure grid 300 is selected to be typically larger than the pixel size of the IC layout design GDS 200 for gaining process throughput. For example, a pixel size in the IC layout design GDS 200 is 0.1 nm and a pixel size in the sub-pixel exposure grid 300 is 3 nm, which is 30 times larger. In the present embodiment, the pixel size of the sub-pixel exposure grid 300 is set as from 0.5 nm to 8.0 nm. When the pixel size of the sub-pixel exposure grid 300 is larger than the IC layout design GDS grid 200, the boundaries of polygons (of the IC layout design) may not match with the boundaries of pixels in some locations in the sub-pixel exposure grid 300, such as in 310A, 310B, 320A and 320B, as shown in FIG. 3. This mismatching generates partial filled pixels in the sub-pixel exposure grid 300, referred to as pixel size truncations. The larger pixel size may result in less amount of computation required in the downstream or later processing, but induces more image errors.

Figure 4:
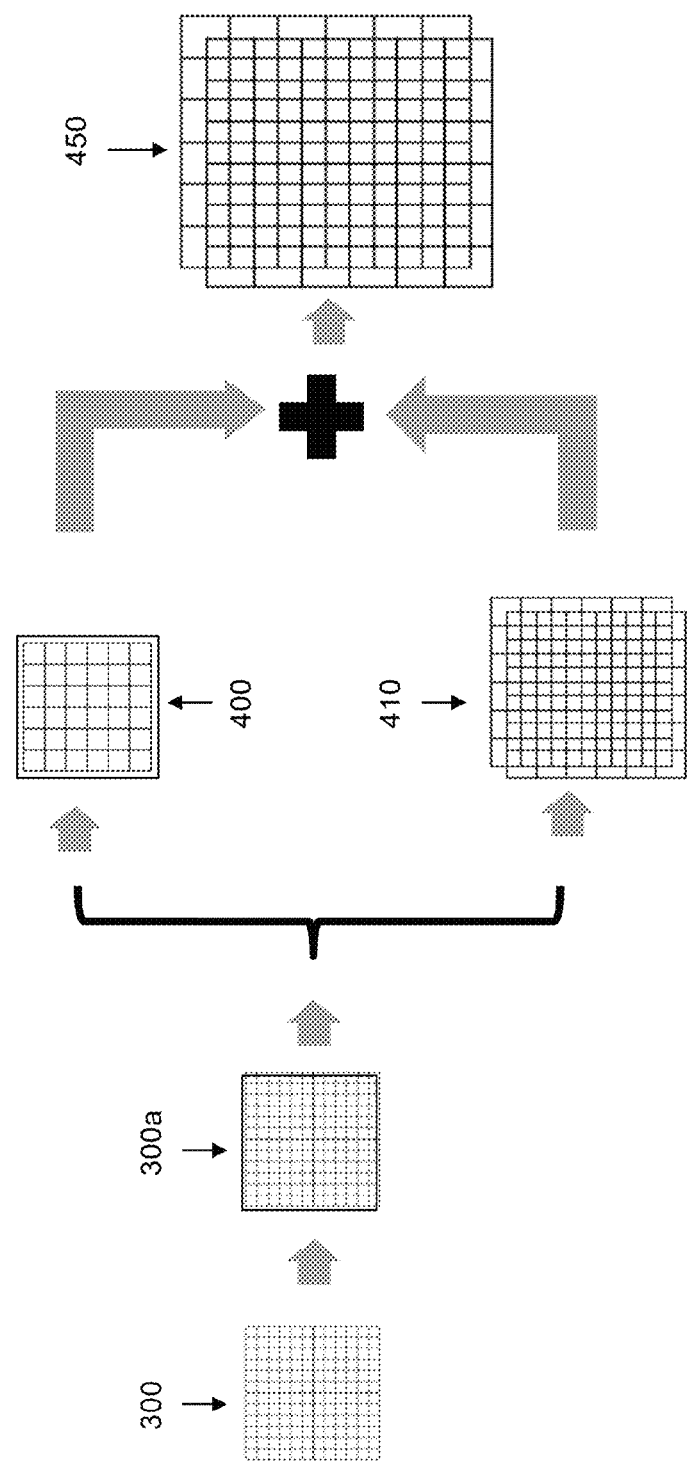
FIG. 4 is a simplified schematic diagram of generation of a second exposure grid of an example embodiment of a method of data preparation in lithography processes at stages constructed according to various aspects of the present disclosure

The method 100 proceeds to step 106 by applying an error-diffusion to the sub-pixel exposure grid 300, as shown in FIG. 4. After receiving the error-diffusion, the sub-pixel exposure grid 300 is referred to as the sub-pixel exposure grid 300a. An error diffusion is a computer graphics technique. As an example, an error diffusion algorithm scans a pixel grid from left to right, top to bottom, quantizing pixel values one by one. A data of an exposure intensity level (referred as to a grey level) is assigned to each pixel. In the error diffusion algorithm, the grey level of a pixel (referred to as a source pixel) is compared to a predetermined grey-level scale, such as the discrete grey-level scales. When the source pixel is completely inside (or outside) of a polygon (the IC layout design feature), the grey level of the source pixel is set to be the maximum (or minimum) of grey-level in the predetermined grey-level scale. When a source pixel is on the polygon edge (hence not completely inside nor completely outside a polygon), the grey level of the source pixel is set to be the closest grey level in the predetermined grey-level scale, now the pixel is referred to as a output pixel. After outputting the pixel, the error diffusion algorithm calculates the difference between the source pixel and the output pixel (a simple subtraction), and then it spreads this difference (referred to as an "error") over neighboring pixels.

For example, in a simple two dimensional error diffusion algorithm, half of the error is added to the next right pixel, one quarter of the error is added to the pixel on the next line below, and another quarter of the error is added to the pixel on the next line below and one pixel forward.

A further refined error diffusion algorithm can disperse the error further away from the current pixel. In the depicted embodiment, a Floyd-Steinberg error diffusion algorithm is applied to the sub-pixel exposure grid 300. In the Floyd-Steinberg error diffusion algorithm, the pixel immediately to the right of the pixel being quantized gets 7/16 of the error (the divisor is 16 because the weights add to 16), the pixel directly below the pixel of being quantized gets 5/16 of the error, and the diagonally adjacent pixels of the pixel being quantized get 3/16 and 1/16.

Alternately, the error diffusion algorithm may includes a modified Floyd-Steinberg error diffusion algorithm, referred to as Fan error diffusion. In the Fan error diffusion, the pixel immediately to the right of the pixel being quantized gets 7/16 of the error, the pixel directly below the pixel being quantized gets 5/16 of the error, the pixel immediately to the left and directly below the pixel being quantized gets 3/16 of the error and the pixel two to the left and directly below the pixel being quantized gets 1/16 of the error (the divisor is 16 because the weights add to 16).

By using error diffusion technique, each time the quantization error is transferred to neighboring pixels, while not affecting the pixels that have already been quantized. An error diffusion technique can successfully make a digitization system be a more analog-like system. Error diffusion is able to increase the filling resolution without reducing the pixel size. Error diffusion results in such a way that the more pixels being rounded downwards, the more likely that the next pixel will be rounded upward. As an average, the quantization error is close to zero.

Figure 5:
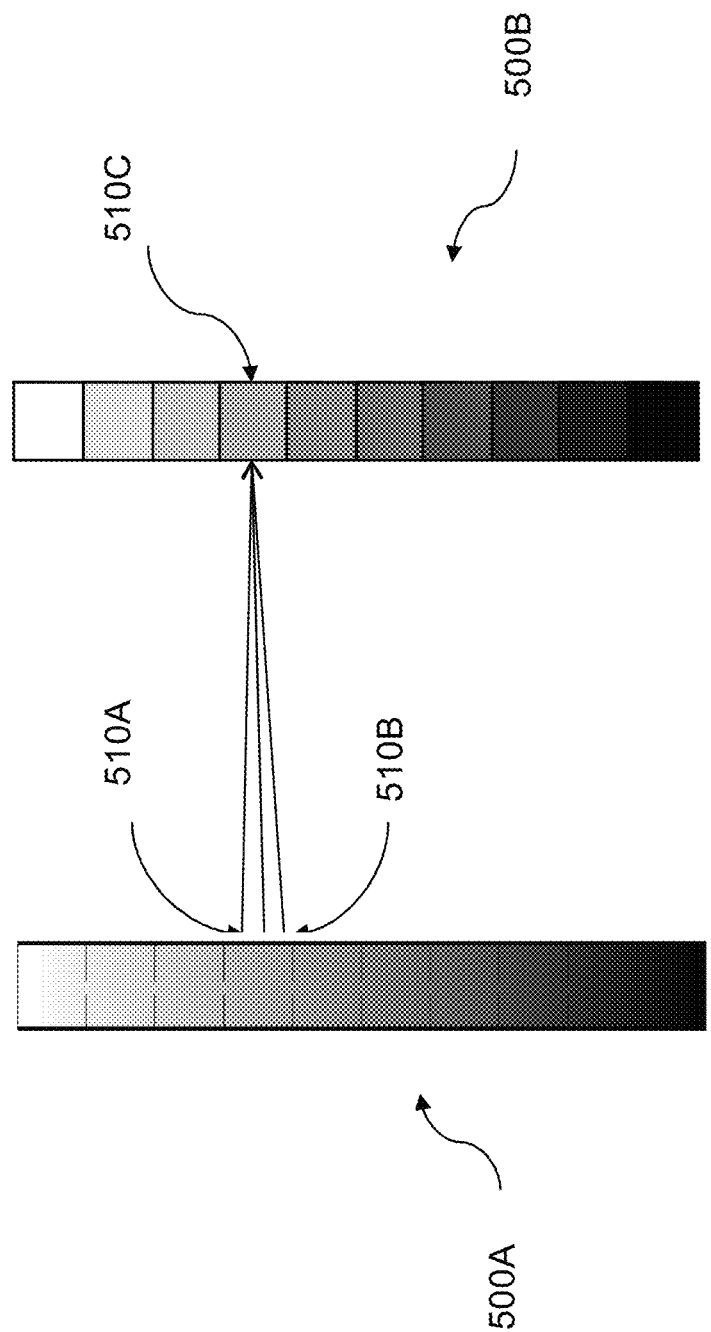
FIG. 5 is a simplified schematic diagram of grey level spectrums of an example embodiment of method of data preparation in lithography process at stages constructed according to various aspects of the present disclosure.

During the error diffusion process, the lithography exposure intensity is quantized, Referring to FIG. 5, from a continuous grey-level spectrum to a discrete grey-level scales 500B. A maximum exposure dose of the discrete grey-level scales 500B is usually set to be the same as the dose used for the black color pixel and the minimum exposure dose of the discrete grey-level scales 500B is usually set to be the same as the one used for the white color pixel, or vice versa. A grey level error is induced when converting from a grey-level spectrum to a discrete grey-level scale. For example, in the grey-level spectrum 500A, all different grey-levels between the level 510A and the level 510B are converted to one grey-level 510C in the discrete grey-level scales 500B. In another words, one grey-level 510C represents all different levels between the level 510A and 510B. An error induced by quantization of grey level is referred to as grey-level truncation.

The exposure dose intensity (grey level) delivered to each pixel is controlled by a quantization state of data bits stored in the sub-pixel exposure grid 300a. For example, if 6 bits are used, a total of 64 grey levels are established in the discrete grey-level scales 500B, from a grey level zero (white color) to a grey level 63 (black color). The more divided the levels of discrete grey-level scales 500B, the closer to the spectrum 500A, the more accurate the grey-level, the more bits are used, and the larger the data volume to be stored and to be computed in data preparation, in the downstream or later processing.

The pixel size truncation and grey-level truncation may induce errors in critical dimension (CD) control and CD uniformity (CDU). The conventional methods to solve pixel size truncation and grey-level truncation are reducing pixel and using more data bit for grey-level scales with a cost of a larger data volume and a longer cycle time in data preparation.

A normalized data volume (NDV) is introduced here to evaluate and compare data volume among different data preparation algorithms. The NDV is defined as data volume per unit area of pixel. The NDV can be calculated from:

$$NDV = GreyLevel\ (bit)/(Pixel\ Size)^2 (nm^2)$$

For example, if the amount of bit used for grey level is k, the GreyLevel (bit) is GreyLevel (k). Under this condition, each pixel's exposure intensity (referred to as grey level) is coded by using a k-bit-digital number. The NDV represents a normalized data volume by a density of allowed grey levels per unit area. As an example, when pixel size of the sub-pixel exposure grid 300 is p nm and the grey level uses k bit (which allows different grey levels of 2 to (bit)$^{th}$ power), the NDV of the sub-pixel exposure grid 300 equals to GreyLevel (k)/p$^2$.

In the depicted embodiment, the grey level of the sub-pixel exposure grid 300a (after receiving the error-diffusion) may be selected to be less than the sub-pixel exposure grid 300. For example, if the grey level of the sub-pixel exposure grid 300 uses k bit (which allows grey levels of 2 to (bit)$^{th}$ power), the grey level of the sub-pixel exposure grid 300a uses (k−1) [which allows half of grey levels of 2 to (bit)$^{th}$ power].

The method 100 proceeds to steps 108a and 108b in parallel. In the step 108a, the sub-pixel exposure grid 300a (after receiving the error-diffusion) converts to an exposure grid 400, as shown in FIG. 4. In the present embodiment, the pixel size of the exposure grid 400 is set as two times of the pixel size in the sub-pixel exposure grid 300. The grey-level of the exposure grid 400 is set to use (k−1) bits, same as the sub-pixel exposure grid 300a. Thus the NDV of the exposure grid 400 equals to ¼ of the sub-pixel exposure grid 300.

Referring also to FIG. 4, in the step 108b, a grid-shift technique is applied to the sub-pixel exposure grid 300a to create a grid-shifted exposure grid 410. For a two-dimension coordinate system of the sub-pixel exposure grid 300a, a grid shift may include shifting the coordinate system along a first direction, or along a second direction, or along both the first and the second directions. In the present embodiment, the coordinate system of the sub-pixel exposure grid 300a shifts one pixel size of the sub-pixel exposure grid 300a in both of the first and the second directions The grid-shifted exposure grid 410 may use a pixel size larger than the pixel size as the sub-pixel exposure grid 300. The grid-shifted exposure grid 410 also may use less bits for the grey level than the sub-pixel exposure grid 300. In the present embodiment, the grid-shifted exposure grid 410 uses pixel size of two times of the pixel size of the sub-pixel exposure grid 300 and uses (k−1) bits for the grey level. Here the grid shifting for the grid-shifted exposure grid 410 is referred to as a ½ grid shift due to the grid shifting in each direction is half of pixel size of the grid-shifted exposure grid 410. The NDV of the grid-shifted exposure grid 410 equals to ¼ of the NDV of the sub-pixel exposure grid 300.

Another of the broader forms of the present disclosure involves applying multiple grid shifts to the sub-pixel exposure grid 300a. The grid shift direction can be independent of each other. The displacement of the grid shift can be independent of each other also.

The method 100 proceeds to step 110 by adding the exposure grid 400 (from the step 108a) to the grid-shifted exposure grid 410 (from the step 108b) to form a second exposure grid 450, as shown in FIG. 4. In the present embodiment, the pixel size and the grey-level of the second exposure grid 450 are same as the exposure grid 400 and the grid-shifted exposure grid 410. Thus the second exposure grid 450 has a pixel size of 2 p nm and uses a grey level of (k−1) bits. The NDV of the second exposure grid 450 is the sum of the NDV of the exposure grid 400 and the NDV of the grid-shifted exposure grid 410, shown below:

$$NDV_{450} = \frac{1}{4}[GreyLevel(k)/p^2] + \frac{1}{4}[GreyLevel(k)/p^2]$$
$$= \frac{1}{2} GreyLevel (k)/p^2 = \frac{1}{2} NDV_{300}$$

Where $NDV_{450}$ is the NDV of the second exposure grid 450, k is the amount of bits being used for the grey level, and $NDV_{300}$ is the NDV of the sub-pixel exposure grid 300. It is shown that the data volume (represent by NDV) of the second exposure grid 450 is half of the sub-pixel exposure grid 300. It has been demonstrated that, with fairly reduced data volume, the second exposure grid 450 achieves a lower critical dimension (CD) error, a better CD uniformity and a lower center mass error than the sub-pixel exposure grid 300.

Based on the discussions above, it can be seen that the present disclosure offers a new data preparation algorithm for lithography process by applying a combination of error diffusion and multiple-grid (MG) shift techniques. The new data preparation algorithm showed reductions of center mass error and truncation error and improvements of CD control and uniformity without increasing data volume.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for use in a lithography process, comprising:
   providing an integrated circuit (IC) layout design in a graphic database system (GDS) grid;
   converting the IC layout design GDS grid to a sub-pixel exposure grid;
   applying an error diffusion technique to the sub-pixel exposure grid, wherein the sub-pixel exposure grid is represented by a first volume of data;
   applying a grid shift technique to the sub-pixel exposure grid to generate a grid-shifted exposure grid;
   converting the sub-pixel exposure grid to an exposure grid with a larger pixel size;
   adding the exposure grid to the grid-shifted exposure grid to generate a second exposure grid, wherein the second exposure grid is represented by a second volume of data that is less than the first volume of data.

2. The method of claim 1, wherein the sub-pixel exposure grid is formed by a two-dimensional array of pixels, and wherein the pixel size is selected to be larger than the pixel size of the IC layout design GDS grid.

3. The method of claim 2, wherein the pixel size of the sub-pixel exposure grid is in the range from 0.5 nm to 8.0 nm.

4. The method of claim 1, wherein the error diffusion technique includes a Floyd-Steinberg error diffusion algorithm.

5. The method of claim 1, wherein the grid shift includes shifting along a first direction.

6. The method of claim 5, wherein the grid shift includes shifting along a second direction.

7. The method of claim 1, wherein the grid shift includes shifting along both a first direction and a second direction.

8. The method of claim 7, wherein the shift equals to a half of pixel size of the grid-shifted sub-pixel exposure grid in each direction.

9. The method of claim 1, wherein multiple grid shifts are applied to the sub-pixel exposure grid.

10. The method of claim 9, wherein the multiple grid shifts shift independently of each other.

11. The method of claim 1, wherein the exposure grid is represented by less bits for grey level than the sub-pixel exposure grid.

12. The method of claim 1, wherein the grid-shifted exposure grid is represented by less bits for grey level than the sub-pixel exposure grid.

13. A method for providing an exposure grid in lithography, comprising:
- providing an integrated circuit (IC) layout design in a graphic database system (GDS) grid;
- converting the IC design layout GDS grid to a sub-pixel exposure grid with pixel size from 0.5 nm to 8.0 nm, wherein the sub-pixel exposure grid is represented by a first volume of data;
- applying a Floyd-Steinberg error diffusion algorithm to the sub-pixel exposure grid;
- applying a grid shift to the sub-pixel exposure grid to generate a grid-shifted exposure grid;
- converting the sub-pixel exposure grid to an exposure grid with a larger pixel size than the pixel size of the sub-pixel exposure grid; and
- combining the exposure grid with the grid-shifted exposure grid to generate a second exposure grid, wherein the second exposure grid is represented by a second volume of data that is less than the first volume of data.

14. The method of claim 13, wherein the sub-pixel exposure grid is represented by more bits for grey level than the exposure grid.

15. The method of claim 13, wherein the grid-shifted exposure grid is represented by less bits for grey level than the sub-pixel exposure grid.

16. The method of claim 13, wherein the pixel size of the grid-shifted exposure grid is two times the pixel size of the sub-pixel exposure grid.

17. The method of claim 13, wherein the pixel size of the exposure grid is two times the pixel size of the sub-pixel exposure grid.

18. The method of claim 13, wherein the pixel size of the second exposure grid is larger than the pixel size of the sub-pixel exposure grid.

19. The method of claim 13, further comprising performing multiple grid shifts to the sub-pixel exposure grid along different directions.

20. A method of providing an exposure grid for a lithography process, comprising:
- providing an integrated circuit (IC) layout design in a graphic database system (GDS) grid with a plurality of polygons in a two-dimensional array of pixels coordinate system;
- applying a proximity correction process to the IC layout design GDS grid;
- converting the IC layout design GDS grid to a sub-pixel exposure grid with a plurality of polygons in a two-dimensional array of pixels coordinate system, wherein the sub-pixel exposure grid is represented by a first volume of data;
- applying the Floyd-Steinberg error diffusion to the sub-pixel exposure grid;
- applying multiple grid shifts to the sub-pixel exposure grid to generate a grid-shifted exposure grid;
- converting the sub-pixel exposure grid to an exposure grid with a pixel size that is two times the pixel size of the sub-pixel exposure grid; and
- adding the exposure grid to the grid-shifted exposure grid to generate a second exposure grid, wherein the second exposure grid is represented by a second volume of data that is less than the first volume of data.

* * * * *